US008686761B2

United States Patent
Ozawa

(10) Patent No.: US 8,686,761 B2
(45) Date of Patent: Apr. 1, 2014

(54) GATE DRIVER AND SWITCHING POWER SOURCE APPARATUS

(75) Inventor: Keiichiro Ozawa, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 204 days.

(21) Appl. No.: 13/238,256

(22) Filed: Sep. 21, 2011

(65) Prior Publication Data

US 2012/0075890 A1 Mar. 29, 2012

(30) Foreign Application Priority Data

Sep. 28, 2010 (JP) ................................. 2010-216947

(51) Int. Cl.
*H02M 1/00* (2007.01)
*H02M 3/335* (2006.01)
*H03K 3/00* (2006.01)
*H03K 17/00* (2006.01)

(52) U.S. Cl.
USPC .......... 327/108; 363/49; 363/21.12; 327/408; 327/109

(58) Field of Classification Search
USPC ........ 363/15, 16, 18, 19, 21.01, 21.12, 21.16, 363/97, 131, 49; 327/108–112, 427, 327/434–437
See application file for complete search history.

(56) References Cited

U.S. PATENT DOCUMENTS

| 6,756,623 B2 * | 6/2004 | Furuie et al. ................... 257/296 |
| 7,514,967 B2 * | 4/2009 | Higashi et al. ................. 327/108 |
| 7,649,755 B2 * | 1/2010 | Kogel et al. ................. 363/21.12 |
| 2007/0274104 A1 * | 11/2007 | Furukoshi et al. .............. 363/16 |
| 2010/0109750 A1 * | 5/2010 | Barrenscheen ............... 327/427 |

FOREIGN PATENT DOCUMENTS

JP 62-144572 6/1987
JP 2009-200891 9/2009

* cited by examiner

Primary Examiner — Bao Q Vu
Assistant Examiner — Zekre Tsehaye
(74) *Attorney, Agent, or Firm* — Oblon, Spivak, McClelland, Maier & Neustadt, L.L.P.

(57) ABSTRACT

A gate driver of a switching element includes a first capacitor having a first end connected to a DC power source, a first switch having a first electrode connected to the first end of the first capacitor and a second electrode connected to a negative electrode of the DC power source, a second switch having a third electrode connected to the second electrode and the negative electrode of the DC power source and a fourth electrode connected to the first capacitor, a second capacitor connected in parallel with the third and fourth electrodes of the second switch and having a first end connected to the DC power source, and a negative voltage controller connecting the gate of the switching element to the second end of the first capacitor and a second end of the second capacitor when the switching element is turned off.

4 Claims, 4 Drawing Sheets

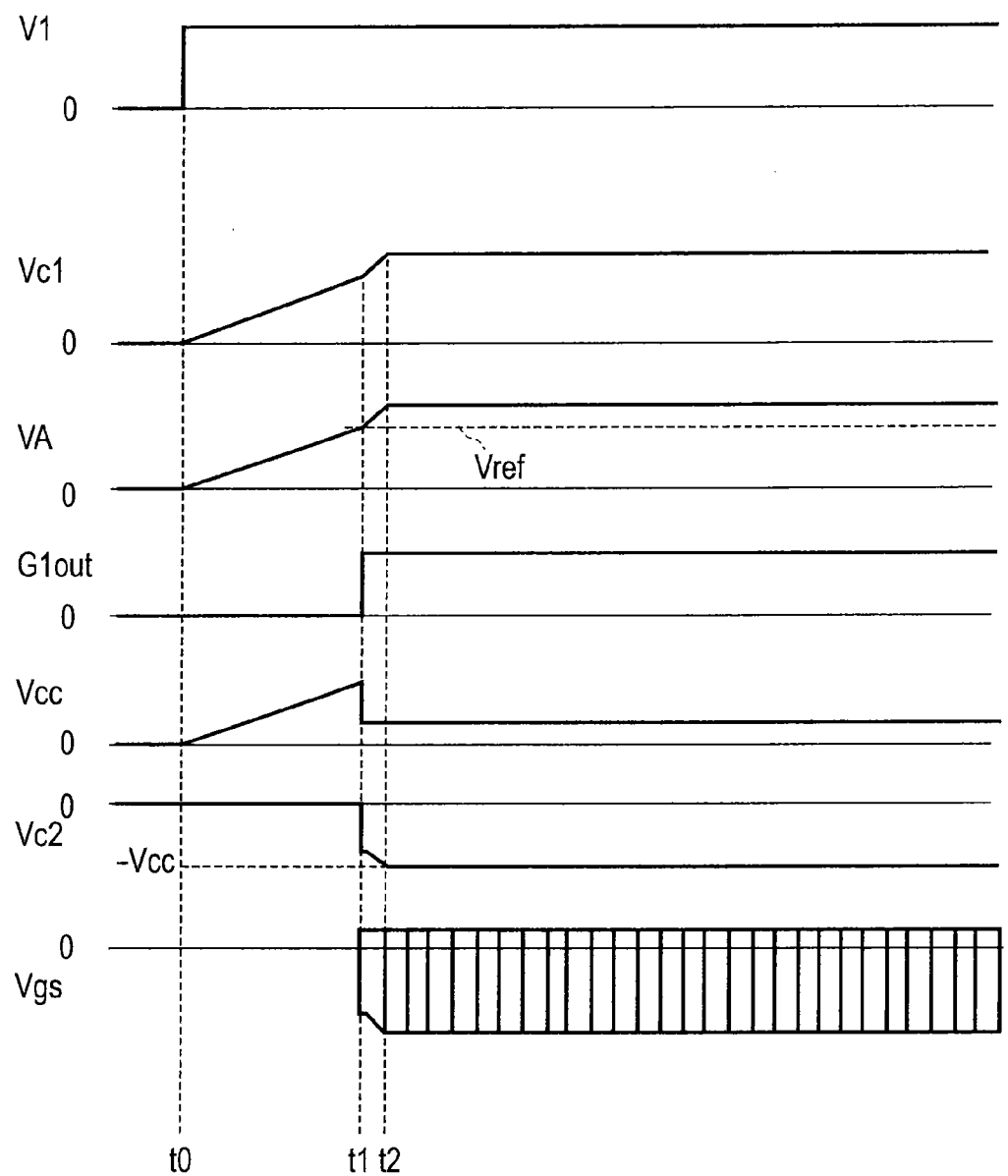

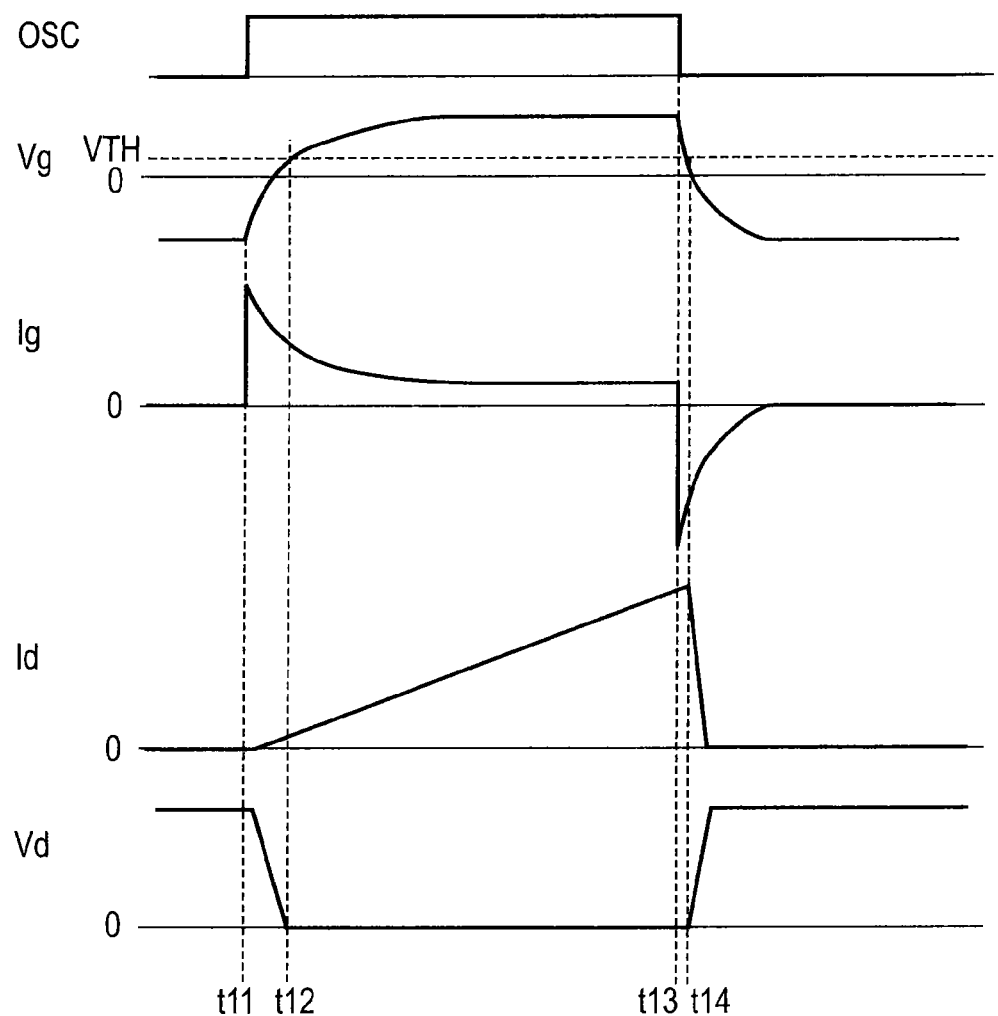

GATE DRIVER AND SWITCHING POWER SOURCE APPARATUS

BACKGROUND OF THE INVENTION

1. Field of the Invention

The present invention relates to a gate driver for driving a gate of a switching element and to a switching power source apparatus having the gate driver.

2. Description of Related Art

An example of a gate driver is disclosed in Japanese Unexamined Patent Application Publication No. S62-144572. FIG. 1 illustrates another example of a gate driver based on Japanese Unexamined Patent Application Publication No. 2009-200891. In FIG. 1, switches 112, 114, and 116 are turned on in an ON period of a main switching element Q10, to charge a capacitor 115 with a power source voltage 111.

In an OFF period of the main switching element Q10, the switches 112, 114, and 116 are turned off and switches 113 and 117 are turned on. At this time, voltage accumulated in the capacitor 115 is used as a reverse bias power source to turn off the main switching element Q10.

Namely, the main switching element Q10 is turned off without particularly using a power source for supplying negative voltage.

SUMMARY OF THE INVENTION

The gate driver according to the related art of FIG. 1 turns off the main switching element Q10 by discharging a gate capacitance of the main switching element Q10 with a discharge current of the capacitor 115 charged with the power source voltage 111. To achieve this, the capacitor 115 must have a large capacitance.

The capacitor 115, therefore, is arranged as an external device for the gate driver that is packaged as an IC (integrated circuit). For the external capacitor 115, the gate driver IC must have two terminals, to increase the cost of the gate driver IC.

At startup, the capacitor 115 is not charged yet. If, under this condition, the gate driver is driven at high frequency, a discharge current for turning off the main switching element Q10 will be insufficient, and therefore, a switching speed will slow down.

The present invention provides a gate driver capable of reducing the capacitance of a capacitor and being packaged together with the capacitor in an IC at low cost, as well as a switching power source apparatus having such a gate driver.

According to an aspect of the present invention, the gate driver for driving a gate of a switching element includes a first capacitor having a first end connected through a startup resistor to a positive electrode of a DC power source, a first switch having a first electrode, a second electrode, and a first control electrode, the first electrode being connected to the first end of the first capacitor, the second electrode being connected to a negative electrode of the DC power source, a second switch having a third electrode, a fourth electrode, and a second control electrode, the third electrode being connected to the second electrode of the first switch and the negative electrode of the DC power source, the fourth electrode being connected to a second end of the first capacitor, a second capacitor connected in parallel with the third and fourth electrodes of the second switch and having a first end connected to the negative electrode of the DC power source, and a negative voltage controller configured to connect the gate of the switching element to the second end of the first capacitor and a second end of the second capacitor when the switching element is turned off. So that the gate of the switching element has a negative voltage.

BRIEF DESCRIPTION OF THE DRAWINGS

FIGS. 3 and 4 are waveform diagrams illustrating operation of the gate driver of FIG. 2.

DESCRIPTION OF PREFERRED EMBODIMENTS

An embodiment of the present invention will be explained in detail with reference to the drawings.

Figure 1:
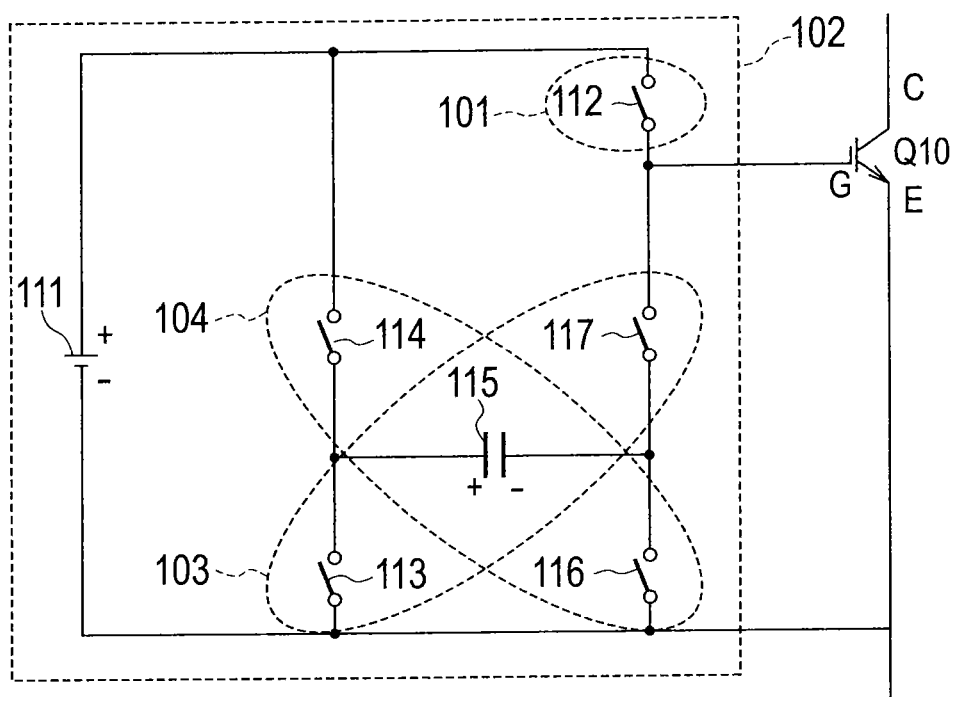
FIG. 1 is a schematic view illustrating an example of a gate driver according to a related art.
Figure 2:
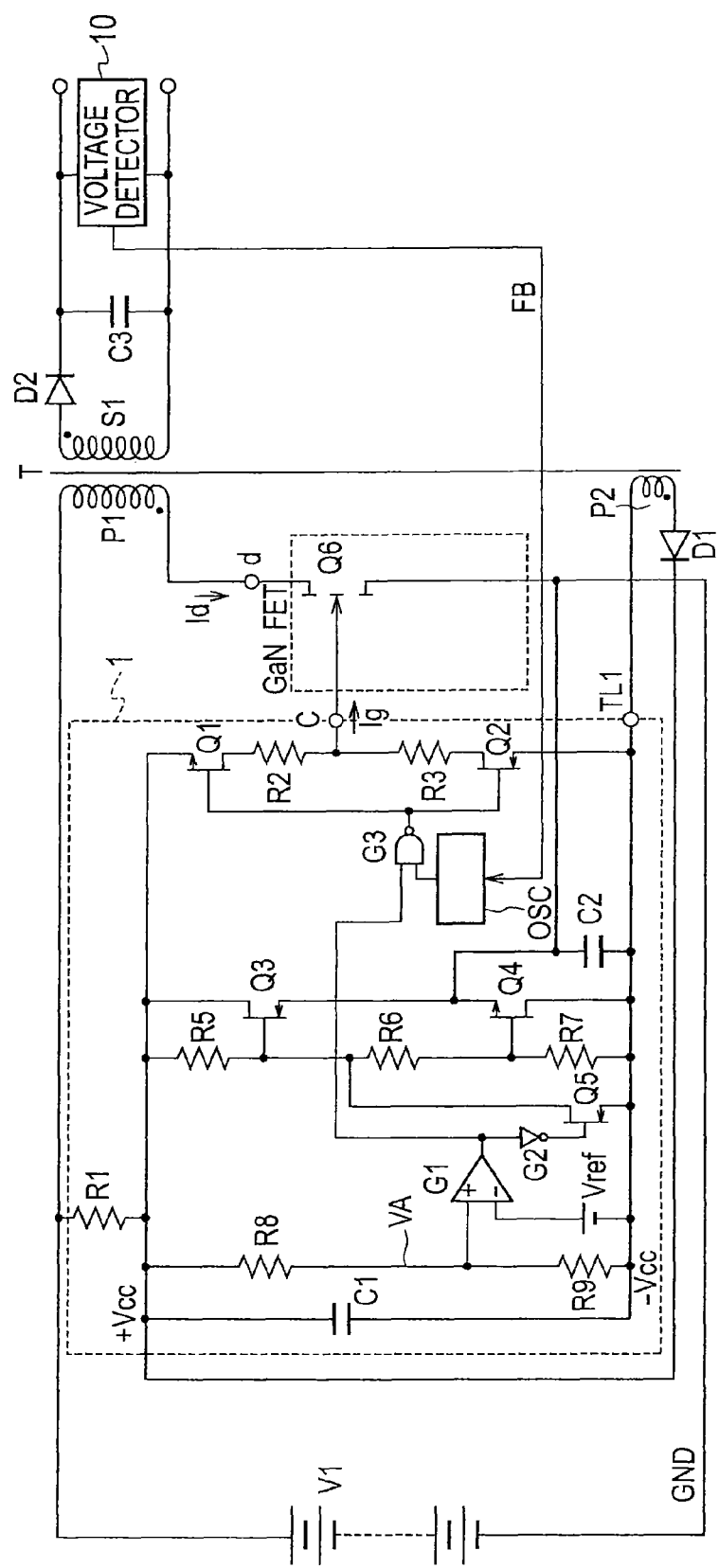
FIG. 2 is a schematic view illustrating a switching power source apparatus having a gate driver according to an embodiment of the present invention.

FIG. 2 is a schematic view illustrating a switching power source apparatus having a gate driver according to an embodiment of the present invention. This switching power source apparatus is a flyback DC-DC converter.

In FIG. 2, a DC power source V1 has a positive electrode connected to a first end of a primary winding P1 of a transformer T and a first end of a startup resistor R1. The startup resistor R1 is included in the gate driver 1. A second end of the primary winding P1 is connected to a switching element, i.e., a drain of an n-type GaN FET Q6. A source of the GaN FET Q6 is connected to a negative electrode of the DC power source V1.

Both ends of a secondary winding S1 of the transformer T are connected to a series circuit that includes a diode D2 and a capacitor C3 and forms a rectifying-smoothing circuit to convert an AC voltage generated by the secondary winding S1 into a DC voltage. A voltage detector 10 detects the DC voltage across the capacitor C3, and based on the detected voltage, generates a feedback signal FB. The feedback signal FB is sent to an oscillator OSC in the gate driver 1, to change the oscillation frequency of the oscillator OSC according to a value of the feedback signal FB.

According to the feedback signal FB from the voltage detector 10 and an output from a comparator G1, the gate driver 1 turns on/off the GaNFET Q6 to convert a DC voltage from the DC power source V1 into an AC voltage through the primary winding P1 of the transformer T. The AC voltage is outputted from the secondary winding S1 of the transformer T.

Transformer T has an auxiliary winding P2 whose both ends are connected to a series circuit that includes a diode D1 and a capacitor C1 and forms a rectifying-smoothing circuit. The rectifying-smoothing circuit converts an AC voltage generated by the auxiliary winding P2 into a DC voltage, which is supplied as a power source voltage after startup to the capacitor C1.

The gate driver 1 will be explained. A second end of the startup resistor R1 is connected to a first end of the capacitor C1 (first capacitor), a first end of a resistor R8, a first end of a resistor R5, a drain of an n-type MOSFET Q3 (first switch), a source of a p-type MOSFET Q1, and a cathode of the diode D1.

The first end of the capacitor C1 is connected through the startup resistor R1 to the positive electrode of the DC power source V1, to receive a voltage +Vcc. A second end of the capacitor C1 is connected to a second end of a capacitor C2 (second capacitor) and receives a voltage −Vcc. The capacitor C1 is used as a single supply source.

Both ends of the capacitor C1 are connected to a series circuit including the resistors R8 and R9, a series circuit including the resistors R5, R6, and R7, a series circuit including the n-type MOSFET Q3 and a p-type MOSFET Q4 (second switch), and a series circuit including the p-type MOSFET Q1, resistors R2 and R3, and an n-type MOSFET Q2. A connection point of the resistors R8 and R9 is connected to a non-inverting input terminal of the comparator G1 having a hysteresis characteristic. An inverting input terminal of the comparator G1 is connected to a reference power source Vref.

An output terminal of the comparator G1 is connected to an input terminal of an inverter G2 and a first input terminal of a NAND gate G3. An output terminal of the inverter G2 is connected to a gate of an n-type MOSFET Q5. A source of the n-type MOSFET Q5 and a negative electrode of the reference power source Vref are connected to the second end of the capacitor C1.

A drain of the MOSFET Q5 is connected to a connection point of the resistors R5 and R6. A connection point of the resistors R5 and R6 is connected to a gate of the MOSFET Q3. The drain of the MOSFET Q3 is connected to the first end of the resistor R5 and the first end of the capacitor C1. A source of the MOSFET Q3 is connected to a source of the p-type MOSFET Q4, a first end of the capacitor C2, the source of the GaN FET Q6, and the negative electrode of the DC power source V1.

A gate of the MOSFET Q4 is connected to a connection point of the resistors R6 and R7 and the drain of the MOSFET Q4 is connected to a second end of the resistor R7 and the second end of the capacitor C2.

The NAND gate G3 operates a NAND logic of a pulse signal from the oscillator OSC and an output from the comparator G1 and outputs a result of the operation to a gate of the p-type MOSFET Q1 and a gate of the n-type MOSFET Q2.

The source of the MOSFET Q1 is connected to the first end of the capacitor C1 and the drain of the MOSFET Q1 is connected to a first end of the resistor R2. A second end of the resistor R2 is connected to a gate of the GaN FET Q6 and a first end of the resistor R3. A second end of the resistor R3 is connected to a drain of the n-type MOSFET Q2. A source of the MOSFET Q2 is connected to the second ends of the capacitors C1 and C2. The MOSFETs Q1 and Q2 form a negative voltage controller to provide the gate of the GaN FET Q6 with a negative voltage when the GaN FET Q6 is turned off.

The drain of the GaN FET Q6 is connected to a first end of the primary winding P1 of the transformer T and the source of the GaN FET Q6 is connected to the negative electrode of the DC power source V1.

The GaN FET Q6 is a HEMT (High Electron Mobility Transistor) such as a GaN FET. Instead, the GaN FET Q6 may be a HEMT such as an SiC-FET, or a MESFET (Metal Semiconductor Field Effect Transistor), or a MISFET (Metal Insulator Semiconductor Field Effect Transistor), or a MISHEMT, or a MISHEMT. Also, the GaN FET Q6 may be a J-FET (Junction FET), or an IGBT (Insulated Gate Bipolar Transistor).

According to the present embodiment, the drain of a MOSFET corresponds to a first electrode, the source thereof to a second electrode, and the gate thereof to a control electrode.

Operation of the gate driver having the above-mentioned configuration according to the embodiment will be explained with reference to the waveform diagrams of FIGS. 3 and 4.

In FIG. 3, V1 is a voltage of the DC power source V1, Vc1 is a voltage of the capacitor C1, VA is a voltage applied to the non-inverting input terminal of the comparator G1, G1out is an output voltage from the comparator G1, Vcc is a voltage applied to the first end of the capacitor C1, Vc2 is a voltage across the capacitor C2, and Vgs is a gate-source voltage of the GaN FET Q6.

In FIG. 4, OSC is a pulse signal from the oscillator OSC, Vg is a voltage applied to the gate of the GaN FET Q6, Ig is a gate current of the GaN FET Q6, Id is a current passing through the drain of the GaN FET Q6, and Vd is a voltage applied to the drain of the GaN FET Q6.

In FIG. 3, the voltage V1 of the DC power source V1 is applied at time t0 to pass a current through a path extending along the positive electrode of the DC power source V1, the startup resistor R1, the capacitor C1, a body diode of the MOSFET Q4, and the negative electrode of the DC power source V1, thereby charging the capacitor C1. As a result, the voltage Vcc at the first end of the capacitor C1 linearly increases.

A voltage across the capacitor C1 is detected with the series-connected resistors R8 and R9. The voltage VA divided by the resistors R8 and R9 is compared in the comparator G1 with the voltage of the reference power source Vref. If the voltage VA is lower than the voltage of the reference power source Vref, the output G1out from the comparator G1 is low.

This low-level output is inverted by the inverter G2 into a high-level signal to turn on the MOSFETs Q5 and Q4. As a result, the capacitor C2 is short-circuited and the voltage Vc2 becomes zero.

At the same time, the first input terminal of the NAND gate G3 receives the low-level output from the comparator G1, and therefore, the NAND gate G3 provides a high-level output to turn off the MOSFET Q1 and turn on the MOSFET Q2. As a result, the gate of the GaN FET Q6 is connected through the resistor R3 and MOSFET Q2 to the second end of the capacitor C1. Namely, the gate of the GaN FET Q6 receives "zero voltage−Vcc" and the GaN FET Q6 is OFF.

At time t1, the voltage VA divided by the resistors R8 and R9 becomes equal to the voltage of the reference power source Vref. The comparator G1 outputs a high-level signal, which is inverted by the inverter G2 into a low-level signal to turn off the MOSFETs Q5 and Q4.

As a result, the MOSFETs Q3 and Q4 are biased by the resistors R5, R6, and R7, so that the MOSFETs Q3 and Q4 turn on to pass currents. Resistance values of the bias current determining resistors R5, R6, and R7 are set so that the MOSFETs Q3 and Q4 may pass very small drain currents.

When the MOSFETs Q3 and Q4 pass the drain currents, the voltage Vc1 of the capacitor C1 is divided into drain-source voltages of the MOSFETs Q3 and Q4 according to a resistance ratio of the resistors R5, R6, and R7. At time t1 in FIG. 3, the source of the MOSFET Q3, the source of the MOSFET Q4, the source of the GaN FET Q6, and a connection point potential GND to which the negative electrode (GND) of the DC power source V1 is connected have a correlation mentioned below.

Potential at the negative electrode (GND) of the DC power source V1 becomes the potential divided into the drain-source voltage of the MOSFET Q3 and the drain-source voltage of the MOSFET Q4, and therefore, the positive electrode voltage Vcc relatively decreases. As a result, the capacitor C2 is charged with the drain-source voltage of the MOSFET Q4, i.e., the negative voltage −Vcc (Vc2 in FIG. 3).

At time t1, the comparator G1 provides a high-level output to turn on the MOSFET Q1 and off the MOSFET Q2 in synchronization with an ON pulse signal (OSC at time t11 in FIG. 4) from the oscillator OSC. This results in causing the gate current Ig of the GaN FET Q6. At this time, the drain current Id of the GaN FET Q6 flows and increases.

At time t12, the gate voltage Vg of the GaN FET Q6 reaches a threshold value VTH and the drain voltage Vd of the GaN FET Q6 becomes zero.

At this time, the current Ig to the gate of the GaN FET Q6 passes through a path extending along the Vcc side of the capacitor C1, the MOSFET Q1, the resistor R2, the gate-source of the GaN FET Q6, the capacitor C2, and the −Vcc side of the capacitor C1.

At time t13, the MOSFET Q1 turns off and the MOSFET Q2 on in synchronization with an OFF pulse signal from the oscillator OSC. At this time, the gate of the GaN FET Q6 is biased through the resistor R3 and MOSFET Q2 to −Vcc, to acquire negative potential.

In this way, the gate driver according to the embodiment employs the capacitor C1 as a single supply source, connects the drain of the MOSFET Q3 to the first end of the capacitor C1, connects the source of the MOSFET Q3 to the source of the MOSFET Q4, connects the drain of the MOSFET Q4 to the second end of the capacitor C1, connects the capacitor C2 in parallel with the MOSFET Q4, connects the connection point of the source of the MOSFET Q3, the source of the MOSFET Q4, and the first end of the capacitor C2 to the negative electrode (GND) of the DC power source V1, and according to a pulse signal generated when the GaN FET Q6 turns off, connects the gate of the GaN FET Q6 to the second ends of the capacitors C1 and C2, to make the gate voltage of the GaN FET Q6 negative without using a charge/discharge current of the capacitor C2.

Accordingly, the present embodiment can reduce the capacitance of the capacitor C2 and package the gate driver 1 including the capacitor C2 into an IC. When packaging the gate drive 1 into an IC, the embodiment has an advantage that it needs only one terminal TL1 for the capacitor C2.

The present embodiment turns off the GaN FET Q6 without using a charge/discharge current of the capacitor C2. Accordingly, the embodiment secures high-frequency operation, shortens a delay at the time of turning off the GaN FET Q6 (time t13 and t14), and reduces a switching loss.

A normally-OFF GaN FET has a low gate threshold voltage such as 1 to 2 V. In connection with this, the embodiment makes the gate voltage of the GaN FET Q6 negative when turning off the GaN FET Q6. With this, the embodiment is capable of setting a large noise margin with respect to external noise such as switching noise from other switching power source apparatuses in a system that employs a plurality of switching power source apparatuses, thereby stabilizing the operation of the system.

The embodiment charges the capacitor C1, and after a voltage that is obtained by dividing the charge voltage of the capacitor C1 by the resistors R8 and R9 exceeds the voltage of the reference power source Vref, operates the gate driver 1. This configuration stably operates the GaN FET Q6 from startup.

After the startup, the auxiliary winding P2 and diode D1 provide an auxiliary power source for the capacitor C1. The auxiliary winding P2 and diode D1 also serve as a positive/negative supply source.

The present invention is applicable to switching power source apparatuses such as DC-DC converters and AC-DC converters.

This application claims benefit of priority under 35 USC §119 to Japanese Patent Application No. 2010-216947, filed on Sep. 28, 2010, the entire content of which is incorporated by reference herein. Although the invention has been described above by reference to certain embodiments of the invention, the invention is not limited to the embodiments described above. Modifications and variations of the embodiments described above will occur to those skilled in the art, in light of the teachings. The scope of the invention is defined with reference to the following claims.

What is claimed is:

1. A gate driver for driving a gate of a switching element, comprising:
a first capacitor having a first end connected through a startup resistor to a positive electrode of a DC power source;
a first switch having a first electrode, a second electrode, and a first control electrode, the first electrode being connected to the first end of the first capacitor;
a second switch having a third electrode, a fourth electrode, and a second control electrode, the third electrode being connected to the second electrode of the first switch and a negative electrode of the DC power source as a ground level, and the fourth electrode being connected to a second end of the first capacitor;
a second capacitor connected in parallel with the third and fourth electrodes of the second switch and having a first end connected to the second end of the first capacitor and a second end connected to the negative electrode of the DC power source; and
a negative voltage controller configured to connect the gate of the switching element to the second end of the first capacitor and the first end of the second capacitor according to a pulse signal when the switching element is turned off, and thereby the gate of the switching element has a negative voltage.

2. The gate driver of claim 1, further comprising:
a first resistor having a first end connected to the first end of the first capacitor;
a second resistor having a first end connected to a second end of the first resistor and a second end connected to the second end of the first capacitor; and
a comparator configured to compare a voltage at a connection point of the first and second resistors with a reference voltage, turns on the second switch to short-circuit the second capacitor if the voltage at the connection point is smaller than the reference voltage, and turns on the first and second switches to charge the second capacitor if the voltage at the connection point is equal to or larger than the reference voltage.

3. The gate driver of claim 1, wherein the switching element is one of HEMT, MESFET, MISFET, bipolar transistor, J-FET, and IGBT.

4. A switching power source apparatus comprising:
the gate driver according to claim 1;
a transformer having a primary winding, a secondary winding, and an auxiliary winding and including a first end connected to the positive electrode of the DC power source and a second end connected to a first end of the switching element;
a rectifying-smoothing circuit configured to rectify and smooth a voltage generated by the secondary winding of the transformer;
a voltage detector configured to detect an output voltage from the rectifying-smoothing circuit and output the detected voltage to the gate driver; and
a diode having a cathode connected to the first end of the first capacitor and an anode connected to a first end of the auxiliary winding, wherein
a second end of the auxiliary winding is connected to the second end of the first capacitor.

* * * * *